United States Patent
Maldonado

(10) Patent No.: US 6,819,197 B2
(45) Date of Patent: Nov. 16, 2004

(54) MULTIPLE BANDWIDTH PHASE LOCK FILTERS FOR MULTIMODE RADIOS

(75) Inventor: David Maldonado, Chula Vista, CA (US)

(73) Assignee: Qualcomm Incorporated

( * ) Notice: Subject to any disclaimer, the term of this patent is extended or adjusted under 35 U.S.C. 154(b) by 61 days.

(21) Appl. No.: 10/060,547

(22) Filed: Jan. 29, 2002

(65) Prior Publication Data

US 2003/0143950 A1 Jul. 31, 2003

(51) Int. Cl.[7] .............................................. H04B 3/04
(52) U.S. Cl. ........................ 333/17.1; 331/17; 331/25; 331/34
(58) Field of Search .......................... 333/17.1; 331/17, 331/25, 34

(56) References Cited

U.S. PATENT DOCUMENTS

| | | | | |
|---|---|---|---|---|
| 3,993,958 A | * | 11/1976 | Cutsogeorge | 331/25 |
| 4,748,425 A | * | 5/1988 | Heck | 332/127 |
| 5,075,639 A | * | 12/1991 | Taya | 331/2 |
| 5,175,729 A | * | 12/1992 | Borras et al. | 370/345 |
| 5,548,829 A | | 8/1996 | Suzuki et al. | 455/180.3 |
| 5,675,292 A | * | 10/1997 | McCune, Jr. | 331/17 |
| 5,836,000 A | * | 11/1998 | Choi | 331/14 |
| 6,057,739 A | | 5/2000 | Crowley et al. | 331/14 |
| 6,064,273 A | * | 5/2000 | Donohue | 331/17 |
| 6,175,281 B1 | * | 1/2001 | Mori | 331/17 |
| 6,476,681 B1 | * | 11/2002 | Kirkpatrick | 331/17 |
| 6,580,328 B2 | * | 6/2003 | Tan et al. | 331/17 |

FOREIGN PATENT DOCUMENTS

| | | | | |
|---|---|---|---|---|
| EP | | 0664617 A2 | 1/1995 | H03L/7/183 |

* cited by examiner

*Primary Examiner*—Benny T. Lee
*Assistant Examiner*—Kimberly Glenn
(74) *Attorney, Agent, or Firm*—Philip Wadsworth; Charles D. Brown; Howard H. Seo

(57) ABSTRACT

An apparatus and method for filtering a signal in a phase lock loop is disclosed. An typical apparatus for filtering a phase error signal comprises a first filter subcircuit receiving a phase error signal from a phase comparator and filtering the error signal when enabled, a second filter subcircuit receiving the phase error signal from the phase comparator and filtering the error signal when enabled and first and second enable switches which are activated in combination to control filtering of at the error signal. The first filter subcircuit is enabled by activating a first combination of the enable switches and the second filter subcircuit is enabled by activating a second combination of the enable switches. A fast acquisition subcircuit can also be used to temporarily underdampen the filter and improve overall performance of the phase lock loop circuit. The filter can be used to obtain multimode operation in a cellular radio.

67 Claims, 8 Drawing Sheets

| Loop Filter | S1 | S2 | S3 | C1 (total) | C2 (total) | R1 (total) |
|---|---|---|---|---|---|---|
| LPF1 (BW1) | Closed | Open | Open | C1 only | C2 only | R1 |
| LPF1 w/FAQ (BW1') | Closed | Open | Closed | C1 only | C2 only | $\frac{R1 \times R1'}{R1 + R1'}$ |
| LPF2 (BW2) | Open | Closed | Open | C1 + C1' | $\frac{C2 \times C2'}{C2 + C2'}$ | R1 |
| LPF2 w/FAQ (BW2') | Open | Closed | Closed | C1 + C1' | $\frac{C2 \times C2'}{C2 + C2'}$ | $\frac{R1 \times R1'}{R1 + R1'}$ |

| Loop Filter | S1 | S2 | S3 | C1 (total) | C2 (total) | R1 (total) |
|---|---|---|---|---|---|---|
| LPF1 (BW1) | Closed | Closed | X | C1 only | C2 only | R1 |
| LPF2 (BW2) | Open | Open | Open | $\frac{C1 \times C1'}{C1 + C1'}$ | $\frac{C2 \times C2'}{C2 + C2'}$ | R1+R1" |
| LPF2 w/FAQ (BW2') | Open | Open | Closed | $\frac{C1 \times C1'}{C1 + C1'}$ | $\frac{C2 \times C2'}{C2 + C2'}$ | $R1 + \frac{R1' \times R1''}{R1' + R1''}$ |

| Loop Filter | S1 | S2 | S3 | C1 (total) | C2 (total) | R1 (total) |
|---|---|---|---|---|---|---|
| LPF1 (BW1) | Closed | Closed | Open | C1 only | C2 only | R1 |
| LPF1 w/FAQ (BW1') | Closed | Closed | Closed | C1 only | C2 only | $\dfrac{R1' \times R1}{R1 + R1'}$ |
| LPF2 (BW2) | Open | Open | Open | $\dfrac{C1 \times C1'}{C1 + C1'}$ | $\dfrac{C2 \times C2'}{C2 + C2'}$ | R1+R1" |
| LPF2 w/FAQ (BW2') | Open | Open | Closed | $\dfrac{C1 \times C1'}{C1 + C1'}$ | $\dfrac{C2 \times C2'}{C2 + C2'}$ | $\dfrac{R1' \times (R1+R1")}{R1+R1'+R1"}$ |

MULTIPLE BANDWIDTH PHASE LOCK FILTERS FOR MULTIMODE RADIOS

BACKGROUND OF THE INVENTION

1. Field of the Invention

The present invention relates to systems and methods for implementing phase lock loop (PLL) circuits in multimode radios, and particularly for implementing PLL circuits in multimode code division multiple access (CDMA) cellular radios that include global positioning system (GPS) receivers and other global systems for mobile communications (GSM) technologies.

2. Description of the Related Art

Phase Locked Loop (PLL) circuits are well known and used for frequency control in a variety of applications. For example, they can be configured as frequency multipliers, demodulators, tracking generators or clock recovery circuits. Each of these applications may demand different characteristics, however they all use the same basic circuit concept.

FIG. 1A illustrates a block diagram of a conventional PLL circuit 100. The operation of this circuit 100 is typical of all phase locked loops. It is basically a feedback control system that controls the phase of a voltage controlled oscillator (VCO) 108. The reference input signal 102 is applied to one input of a phase comparator 104. The other input of the phase comparator 104 is connected to the output of the VCO 108 via the feedback loop 110. The output of the phase comparator 104 is a voltage proportional to the phase difference between the two inputs. This signal is applied to the loop filter 106. The characteristics of the loop filter 106 can be selected to achieve the desired closed loop dynamic characteristics of the PLL circuit 100. The filtered signal controls the VCO 108 and the output of the VCO 108 is directed back to the phase comparator 104 via the feedback loop 110 to "lock" the output to the reference input signal 102.

Normally the loop filter 106 is designed to match the characteristics required by the application of the PLL circuit 100. If the PLL circuit 100 is to acquire and track a varying reference signal 102, the bandwidth of the loop filter 106 will be greater than if it is applied to a more limited input frequency. The frequency range which the PLL circuit 100 will accept and lock on is known as the capture range. Once the PLL circuit 100 is locked and tracking a signal, the range of frequencies that the PLL circuit 100 will follow is called the tracking range. Generally, the tracking range is larger than the capture range.

The characteristics of the loop filter 106 also determine how quickly the frequency of the reference signal 102 can change and still maintain lock. This is termed as the maximum slewing rate. The narrower the loop filter 106 bandwidth is, the slower the response and smaller the capture range will be.

PLL circuits are particularly useful in communications electronics for generating accurate and stable oscillator reference signals in radio receivers and transmitters. For example, the PLL circuit output can be used for channel selection for such receivers and transmitters.

However, evolving and diversifying communications standards and particularly those related to cellular radios, have resulted in a need for radio transceivers which can operate in different modes and accommodate more than one standard and frequency band. For example, a cellular radio which supports CDMA 1x and/or global system for mobile communications (GSM) general packet radio service (GPRS) and wideband code division multiple access (WCDMA) is desirable. To support multimode capabilities, there is a need for more than one reference oscillator within a single transceiver. A conventional design would include two separate PLL circuits and switch between them as necessary, however such an approach increases the size, cost and overall design efficiency of the transceiver. In addition, there is also a need for such PLL circuits to quickly acquire the new frequency when they are switched from one band to another.

Accordingly, there is a need in the art for PLL circuits which operate across multiple frequencies to support one or more VCOs and multiple standards in multimode radio cellular devices. For example, standards such as CDMA 1x, GPS and/or GSM/GPRS and WCDMA should all be supportable by such circuits. There is also a need for such circuits to operate at very high speed, quickly acquiring a new frequency when they are switched to a different mode. Moreover, there is a need in the art to obtain all of the foregoing, while maximizing the design efficiency and minimizing size and costs. The present invention meets all these needs.

SUMMARY OF THE INVENTION

An apparatus and method for filtering a signal in a phase lock loop is disclosed. An typical apparatus for filtering a phase error signal comprises a first filter subcircuit receiving a phase error signal from a phase comparator and filtering the error signal when enabled, a second filter subcircuit receiving the phase error signal from the phase comparator and filtering the error signal when enabled and first and second enable switches which are activated in combination to control filtering of the error signal. The first filter subcircuit is enabled by activating a first combination of the enable switches and the second filter subcircuit is enabled by activating a second combination of the enable switches. A fast acquisition (FAQ) subcircuit can also be used to temporarily underdampen the filter and improve overall performance of the phase lock loop circuit. The filter can be used to obtain multimode operation in a cellular radio.

In one embodiment, where the second filter subcircuit has a higher bandwidth than the first filter subcircuit, the second filter subcircuit can be momentarily activated to fast acquisition with the first filter subcircuit.

In another embodiment, the first filter subcircuit and the second filter subcircuit share common circuit elements. In addition, when the first enable switch is activated, either filter subcircuit can be alternately referenced to a ground or a common cathode voltage selectable by a reference switch. Futhermore, the first and second enable switches can be field effect transistors. The filter can be used to obtain multimode operation in a cellular radio.

In one embodiment, a fast acquisition subcircuit including a fast acquisition enable switch and wherein fast acquisition of one of the first and second filter subcircuits is enabled when the fast acquisition switch is enabled. The fast acquisition subcircuit can be temporarily enabled to underdampen the filter, thereby improving the overall performance of the PLL circuit. The fast acquisition subcircuit can comprise a fast acquisition resistor which is used to alter the resistance characteristic of the filter subcircuit when the fast acquisition switch is enabled. Furthermore, the fast acquisition subcircuit can be coupled to the first or second filter subcircuit. As with the filter subcircuits, the fast acquisition subcircuit can be alternately referenced to a ground and common cathode voltage selectable by a reference switch.

In another shared element embodiment of the invention, the shared common circuit elements are a first capacitor and a first resistor in series both connected in parallel to a second capacitor. Furthermore, the first filter subcircuit can be a subset of the second filter subcircuit.

In different embodiments of the invention various switch combinations may be used to operate the filter and change its characteristics. In one embodiment the first combination comprises activating the first enable switch and deactivating the second enable switch which places a first capacitor in series connection with a first resistor both in parallel connection with second capacitor. The second combination comprises deactivating the first enable switch and activating the second enable switch which places a first and third capacitor in parallel connection, both in series connection with a first resistor and the first and third capacitor and first resistor are all placed in parallel connection with a second and fourth capacitor in series connection. In another embodiment, the first combination comprises activating the both the first enable switch and the second enable switch which places a first capacitor in series connection with a first resistor both in parallel connection with second capacitor. The second combination comprises deactivating both the first enable switch and the second enable switch which places a first and third capacitor and a first resistor all in series connection, all placed in parallel connection with a second and fourth capacitor in series connection.

In another embodiment, the first and second filter subcircuits each comprise a resistor-capacitor filter including a first capacitor and a first resistor in series both connected in parallel to a second capacitor.

Finally, the first and second filter subcircuits of the present invention can be implemented on a single integrated circuit. The first and second enable switches can be internal or external to the integrated circuit.

In addition the present invention also teaches a method having features like those of the described apparatus. The typical method comprises the steps of filtering a signal in a phase lock loop, comprising the steps of receiving a phase error signal from a phase comparator, filtering the error signal with a first filter subcircuit when a first enable switch is activated and filtering the error signal with a second filter subcircuit when a second enable switch is activated.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

1. Overview

The present invention is directed to a PLL circuit design capable of supporting more than one mode of operation. Such a circuit is useful in cellular radios designed to operate with more than one bandwidth and communication standard. For example, a PLL circuit which can support CDMA 1× or GSM (GPRS) and WCDMA would enable a cellular radio to operate in either system as required by the location or system reference of the user. Thus, such a PLL circuit enable system roaming of the user.

Figure 1A:
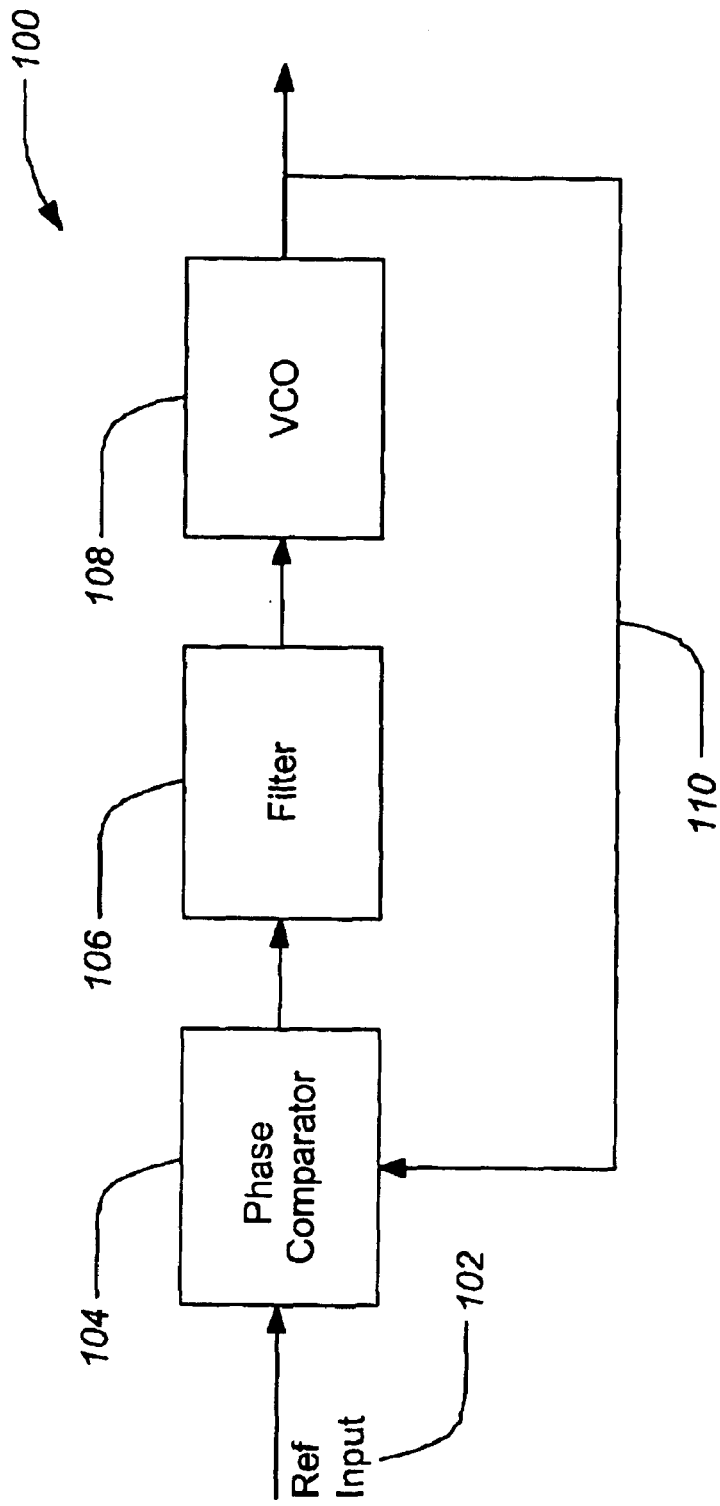
FIG. 1A illustrates a block diagram of a conventional PLL circuit.
Figure 1B:
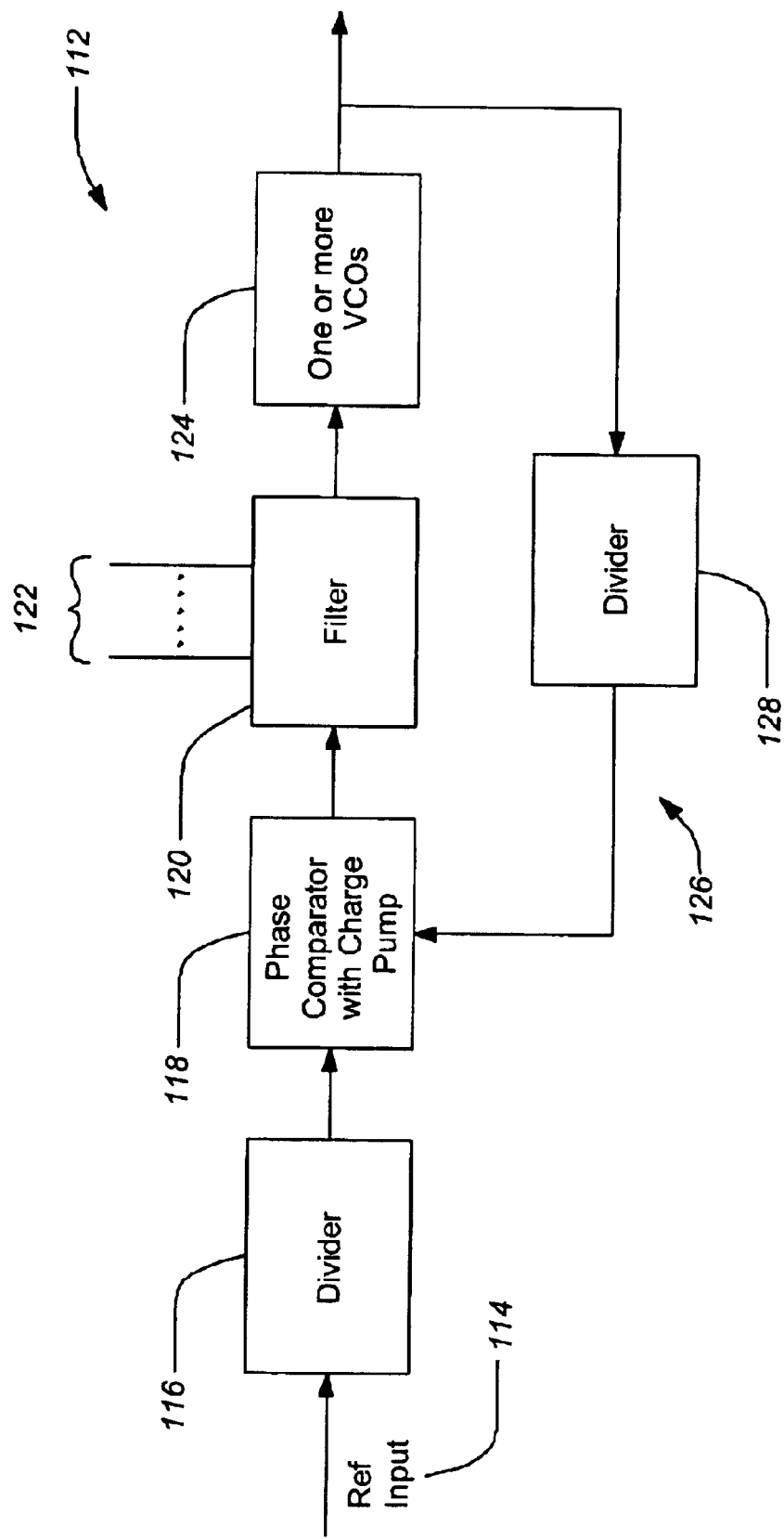
FIG. 1B illustrates a block diagram of a PLL circuit employing a loop filter embodiment of the present invention.

FIG. 1B is a block diagram of a PLL circuit 112 embodiment using the present invention. A reference input signal 114 is supplied to the circuit 112. The input can be optionally directed through a divider 116 to reduce the frequency of the signal 114. The signal 114 is then directed to a phase comparator 118 which determines a phase difference between the signal 114 and an output from a voltage controlled oscillator 124 downstream from the phase comparator 118. The output from the voltage controlled oscillator 124 is fed back to the phase comparator via feedback loop 126. Optionally, the feedback loop 126 may include a loop divider 128 to reduce the frequency of the output before processing by the phase comparator 118. The phase comparator 118 produces an output based upon the phase difference between the signal 114 and the output from the voltage controlled oscillator 124. The phase comparator 118 may be digitally controlled and include a charge pump to produce an output comprising regulated current pulses as the output of the phase comparator 118.

The output of the phase comparator 118 is used to control the output frequency of the VCO 124. To achieve this, regulated current pulses from the phase comparator 118 must be converted into a voltage via the loop filter which can be applied to the VCO 124. In addition, the filtered phase difference signal may be supplied to more than one VCO 124.

In one embodiment, this can be accomplished by a filter 120. The filter 120 receives the output of the phase comparator 118 and appropriately filters the signal for use by the VCO 124. In support of multiple modes and bandwidths, different filtering properties are required. The filtering properties of the filter are alterable through one or more switches enabled with signals applied at inputs 122. Thus, the output of the filter 120 is applied to the one or more VCOs 124 to lock the phase of the output to the reference input signal 114.

2. Example Filter Embodiments

The present invention is directed to a PLL filter wherein filter subcircuits are selectively enabled to alter the properties of the filter. Various embodiments of the filter may be used in the PLL circuit of FIG. 1B to support multimode operation and multiple bandwidths in a cellular radio.

Figure 2A:
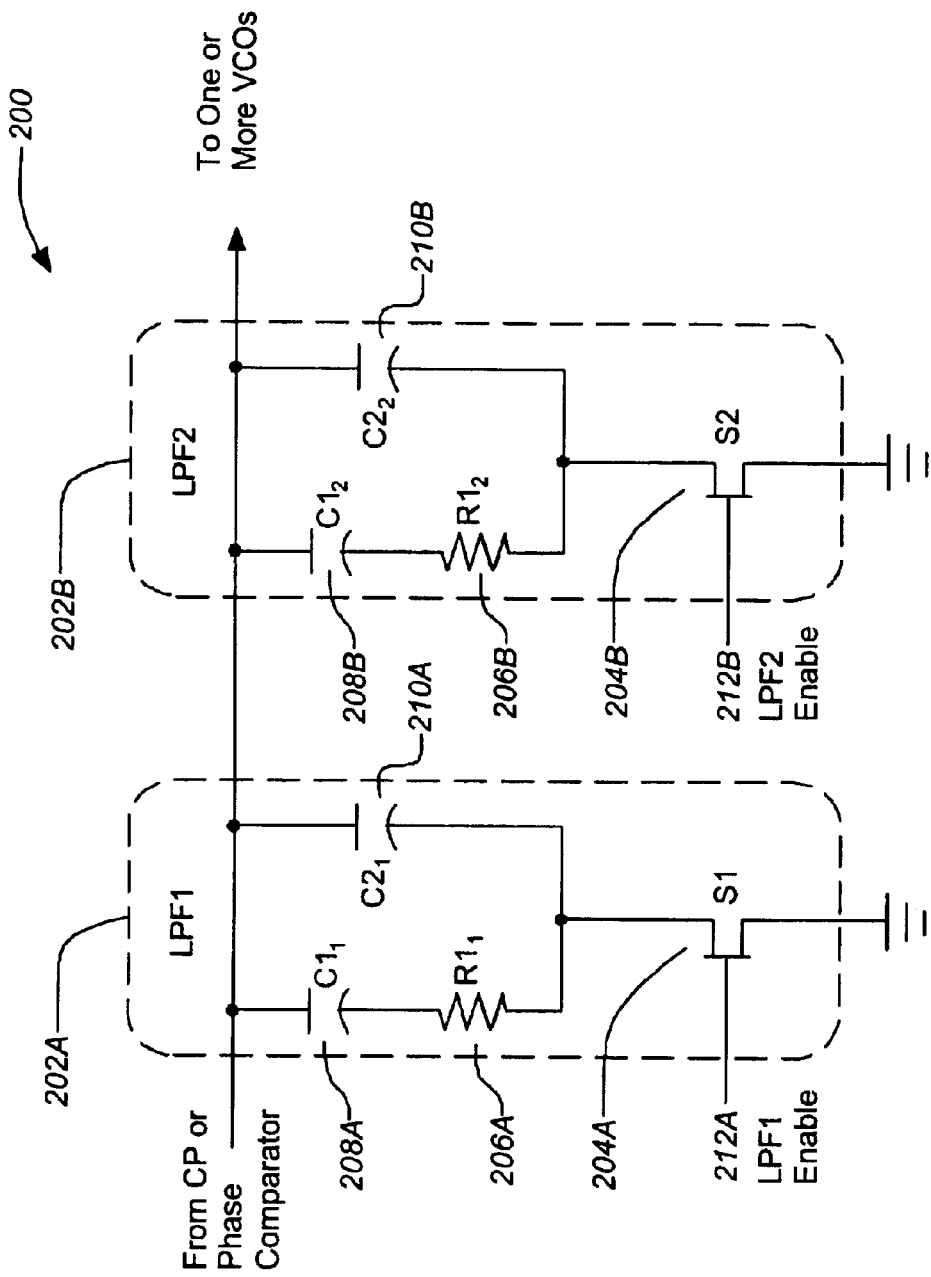
FIG. 2A is a circuit diagram of a first embodiment of the present invention.

FIG. 2A is a circuit diagram of a first filter 200 embodiment of the present invention. The filter 200 receives an input from the phase comparator 118 (or particularly, the charge pump of the comparator 118) and then filters the input to produce an output voltage to one or more VCOs 124. The filter 200 comprises at least two filter subcircuits 202A, 202B which are separately enabled by switches 204A, 204B, respectively. To enable filter subcircuit 202A, first switch 204A is activated and second switch 204B is deactivated in a first switch combination. Likewise, to activate filter subcircuit 202B, second switch 204B is activated and first switch 204A is deactivated in a second switch combination. The subcircuits 202A, 202B each include a resistor-capacitor filter with a first resistor 206A, 206B and first capacitor 208A, 208B in series, both in parallel with a second capacitor 210A, 210B. The filter subcircuits 202A, 202B are selectively activated by inputs 212A, 212B (such as the inputs 122 of FIG. 1B) applied to their respective switches 204A, 204B. In one embodiment, the switches 204A, 204B are semiconductor switches such as field effect transistors (FETs), however, other switch elements can be used, including microelectromechanical switches, npn or pnp transistors, pin diodes, or similar devices.

Each of the filter subcircuits 202A, 202B are separately designed to operate with the remainder of the PLL circuit 112 to lock to a different frequency and thereby support a different mode of operation. For example, first filter subcircuit 202A may be optimized for CDMA 1× mode operation, while the second filter subcircuit 202B is optimized for GSM GPRS mode operation. Design of the filter subcircuits 202A, 202B is effected through the selection of values for the resistor 206 and capacitor 208, 210 circuit elements. Any number of filter subcircuits 202 may be added to the filter in the manner described to support any number of bands with one or more VCOs in the overall PLL design.

Each loop filter (e.g., filter subcircuit) can be designed with independent charge pump current (CPi) settings. When switching between multiple filter subcircuits, such as filter subcircuits 202A, 202B, the change in the filter bandwidth may require a related change in the supplied charge pump current supplied by the phase comparator 118.

Figure 2B:
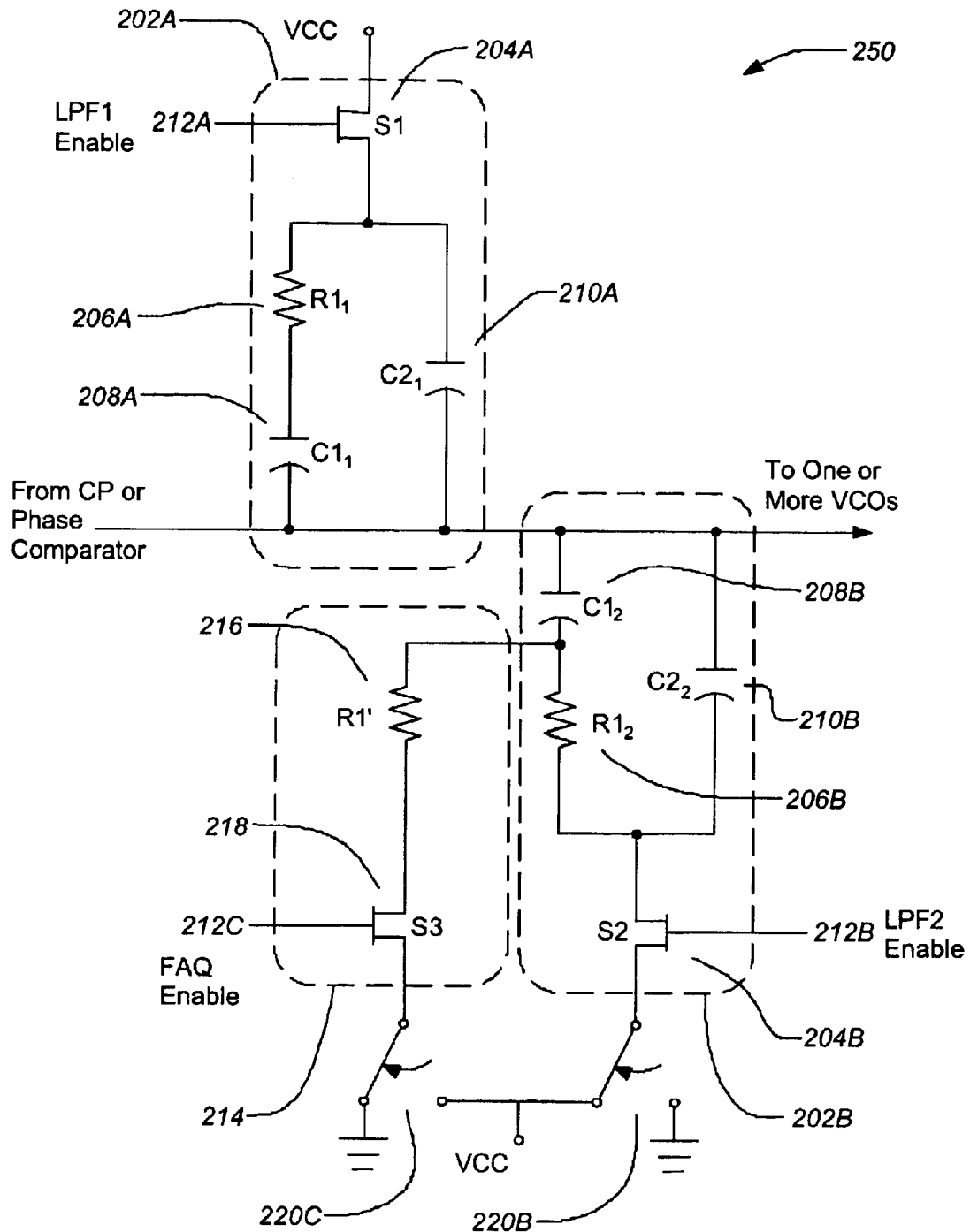
FIG. 2B is a circuit diagram of a second embodiment of the present invention.

FIG. 2B is a circuit diagram of a second filter 250 embodiment of the present invention. The filter 250 also includes filter subcircuits 202A, 202B, however, this filter 250 is shown with a slightly different arrangement than that of FIG. 2A. Preferably, the filter 250 can be implemented with switches 204A, 204B on an integrated circuit using discrete external filter components. This filter subcircuits 202A, 202B or this second filter 250 are enabled with switch combinations identical to the first filter 200 embodiment.

In addition, at least one of the subcircuits 202B includes a fast acquisition subcircuit 214. The fast acquisition subcircuit 214 includes a fast acquisition resistor 216 which is placed in parallel with the resistor 206B of one of the filter subcircuits 202B when fast acquisition switch 218 is enabled. In fast acquisition, the total resistance of the filter decreases and the charge pump current increases by a factor, F, and causes a bandwidth expansion. Fast acquisition may be temporarily activated to enable fast acquisition of the signal. Or fast acquisition can be forced to obtain a wider loop bandwidth. The charge pump current changes by a factor, F, equal to the square of the ratio of bandwidth change. For example, if switching the filter subcircuit results in doubling the bandwidth, the charge pump current increases four times. In contrast, if switching the filter subcircuit results in halving the bandwidth, the charge pump current is cut to one quarter the value.

Table 1 below provides examples of bandwidth expansion, FAQ and the total effective resistance ($R_{TOTAL}$) for parallel fast acquisition resistor 216, which are correlated by a factor (F). As discussed above, the charge pump current changes by the factor, F, when the bandwidth changes. Closing fast acquisition switch 218 expands the bandwidth of filter subcircuit 202B by the factor, F, (i.e. properly setting the charge pump current). Thus, three selectable filters are effectively available in the circuit 250, filter subcircuits 202A and 202B and filter subcircuit 202B with the fast acquisition subcircuit 214 enabled.

TABLE 1

Fast Acquisition Bandwidth Expansion for Parallel Fast acquisition Resistor

| Bandwidth Expansion | Fast Acquisition (FAQ) | $R_{TOTAL} = (R1//R1')$ |
|---|---|---|
| $\approx \sqrt{F}$ | ×F | $\dfrac{R1}{\sqrt{F}}$ |
| $\approx \sqrt{4}$ | ×4 | $\dfrac{R1}{\sqrt{4}}$ |
| $\approx \sqrt{8}$ | ×8 | $\dfrac{R1}{\sqrt{8}}$ |
| $\approx \sqrt{16}$ | ×16 | $\dfrac{R1}{\sqrt{16}}$ |

The total effective resistance for parallel resistors 206B, 216 is given by the following equation (1).

$$R_{TOTAL} = \frac{R1' \times R1}{R1' + R1} \qquad (1)$$

Thus, the necessary value for the fast acquisition resistor (R1') 216 can be determined by applying the appropriate $R_{TOTAL}$ value to the following equation (2).

$$R1' = \frac{R1 \times R_{TOTAL}}{R1 - R_{TOTAL}} \qquad (2)$$

Or, in the general form, including the factor, F, R1' can be determined from equation (3).

$$R1' = \frac{R1}{\sqrt{F} - 1} \qquad (3)$$

For example, to obtain a bandwidth expansion of $\sqrt{16}$ and FAQ of ×16 (under a commensurate sixteen fold charge pump current increase), the fast acquisition resistor 216 should have a value of approximately one-third the resistor 206B of the associated filter subcircuit 202B. The switch 218 can be enabled with an input 212C applied at the switch 218. With fast acquisition enabled, the loop bandwidth of the filter subcircuit 202B is increased by underdamping the filter, thereby providing a quicker tuning time as indicated in the table above. Although shown only on a single filter subcircuit 202B, fast acquisition may be implemented on any or all of the subcircuits of the filter, thereby increasing the effective number of available filters. After tuning, fast acquisition may be disabled to return the filter to its regular damping characteristics as determined by the filter subcircuit (s) 202A, 202B (i.e. the effective total resistance is returned to R1). Also, when leaving fast acquisition, the charge pump current returns to its previous steady state current. Such temporary enabling of the fast acquisition subcircuit 214 can be used to improve the overall tuning time of the PLL circuit.

It should also be noted that in some embodiments fast acquisition can be implemented by temporarily activating a filter subcircuit having a higher bandwidth. For example, if filter subcircuit 202B has a higher bandwidth than filter subcircuit 202A, filter subcircuit 202B can be applied to fast acquisition filter subcircuit 202A. In this case, filter subcircuit 202B is momentarily enabled to produce a similar effect, as discussed above, as applying a dedicated fast acquisition subcircuit. The charge pump current is temporarily adjusted for the bandwidths of the two filter subcircuits 202A and 202B. In this way, fast acquisition can also be effected for at least the lower bandwidth subcircuits in filter circuits without a fast acquisition subcircuit (such as filter circuit 200).

Furthermore, FIG. 2B also illustrates that the filter subcircuits 202A, 202B and fast acquisition subcircuit 214 may be enabled by referencing the subcircuits 202, 214 to ground or a common cathode voltage (VCC) through their respective switches 204, 218. Selection of either ground or VCC for the filter subcircuit 202B or the fast acquisition subcircuit 214 is enabled through the respective reference switches 220B, 220C. (Note there is no reference switch 220A for filter subcircuit 202A in the example shown.) This arrangement is useful in the event that the PLL circuit 112 uses more than one VCO 124 having different varactor references. Although the reference switches 220B, 220C are shown schematically as mechanical switches 220B, 220C, other switch elements can be used, including semiconductor switches, e.g., FETs, npn or pnp transistors, pin diodes, microelectromechanical switches, or similar devices.

Figures 3A, 3B:
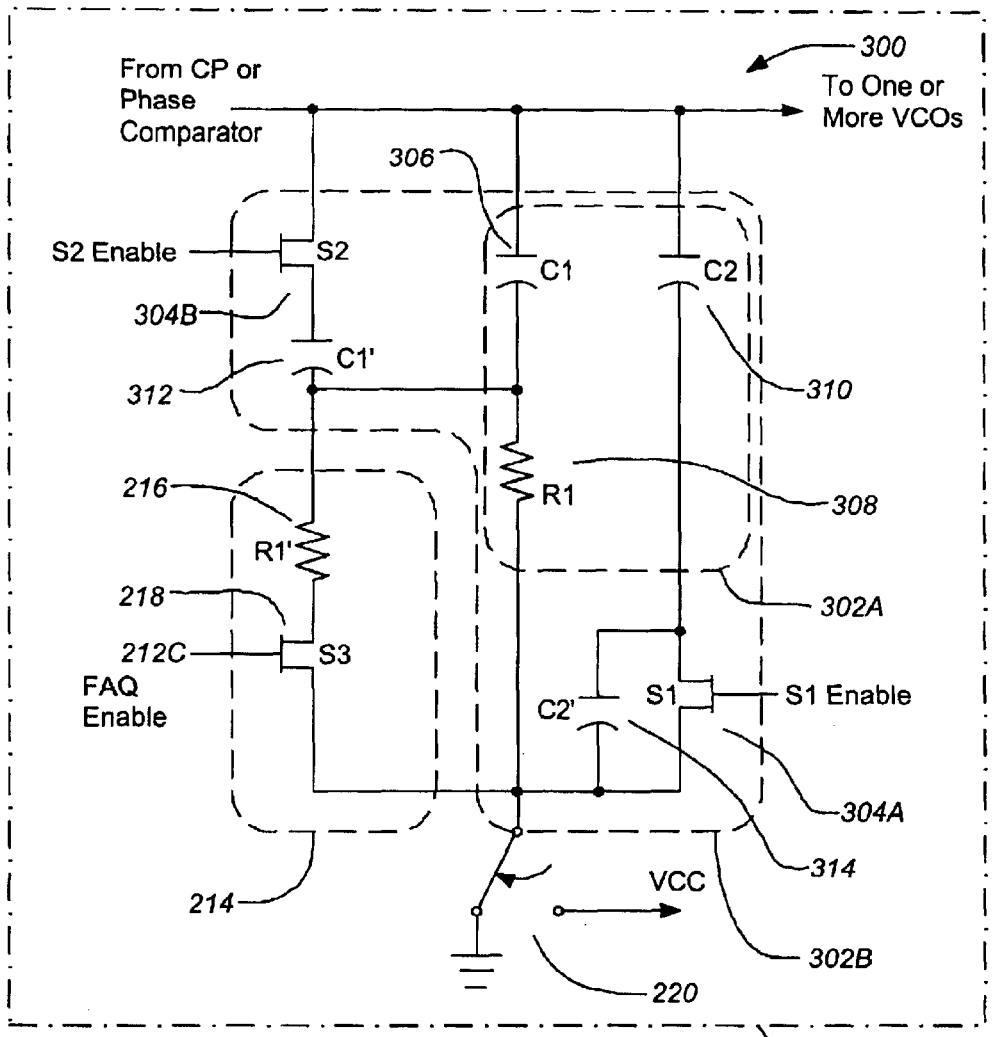
FIG. 3A is a circuit diagram of a third embodiment of the present invention.
FIG. 3B is a table showing the enable switch combinations of the third embodiment.

FIGS. 3A and 3B are a circuit and control matrix of a third filter circuit 300 embodiment of the present invention. FIG. 3A is diagram of the filter circuit 300. In this filter 300, multimode support is integrated into a single integrated circuit 316 operated by switches. Such an integrated design is accomplished by employing a common resistor value in the otherwise separate subcircuits 202A, 202B of the previous embodiments. The resulting circuit includes subcircuits 302A, 302B which use common filter elements for different modes. In the example shown, the filter circuit elements of subcircuit 302A are a subset of the filter circuit elements of subcircuit 302B. In other words, the common filter circuit elements are all the filter circuit elements of subcircuit 302A. Different modes of operation are effected by enabling and disabling switches 304A, 304B and fast acquisition enable switch 218 according to the switch combinations of table of FIG. 3B to produce the circuit characteristics shown.

In a first mode, filter subcircuit 302A is enabled by activating first filter switch 304A and deactivating second filter switch 304B. This produces a filter with a first capacitor 306 in series with a first resistor 308 and both in parallel with a second capacitor 310. In a second mode, filter subcircuit 302B is enabled by activating second filter switch 304B and deactivating first filter switch 304A. Also, in this second mode a charge pump current setting different from that of the first mode may be used. In this case, a third capacitor 312 is placed into the second filter subcircuit 302B in parallel with the first capacitor 306 and thus provides an effective total capacitance equal to the sum of the first and third capacitors 306, 312, as described by the following equation (4).

$$C_{TOTAL} = C1 + C1' \quad (4)$$

This combination of capacitors 312, 306 is in series connection with the first resistor 308. In addition, the second capacitor 310 is now placed in series combination with a fourth capacitor 314, yielding a total effective capacitance given by the following equation (5).

$$C_{TOTAL} = \frac{C2 \times C2'}{C2 + C2'} \quad (5)$$

The effective total capacitances and resistances are shown in the table of FIG. 3B according to the indicated combined operation of switches 304A, 304B, 218.

As with the previous embodiments, a fast acquisition subcircuit 214 is also appended to the filter circuit 300 and operates according to the characteristics previously described. In this case, because the subcircuits 302A, 302B are conjoined, the fast acquisition subcircuit 214 may be activated for either subcircuit 302A, 302B. Alternately, the filter subcircuit (e.g., 302B) having a higher bandwidth can be temporarily activated to fast acquisition the lower bandwidth subcircuit (e.g., 302A) as previously discussed with respect to filter circuits 200 and 250. The filter circuit 300 also includes a reference switch 220 for selection of either ground or VCC for the filter subcircuit 302.

The third filter circuit 300 shown produces a filter in which the first mode of operation (enabling subcircuit 302A) has a lower bandwidth than the second mode of operation (enabling subcircuit 302B). This is made possible by using a common first resistor 308 for entire filter circuit 300. As a result, the circuit is more compact and thus all the filter switches and fast acquisition switch may be integrated into the PLL integrated circuit 316.

Figures 4A, 4B:
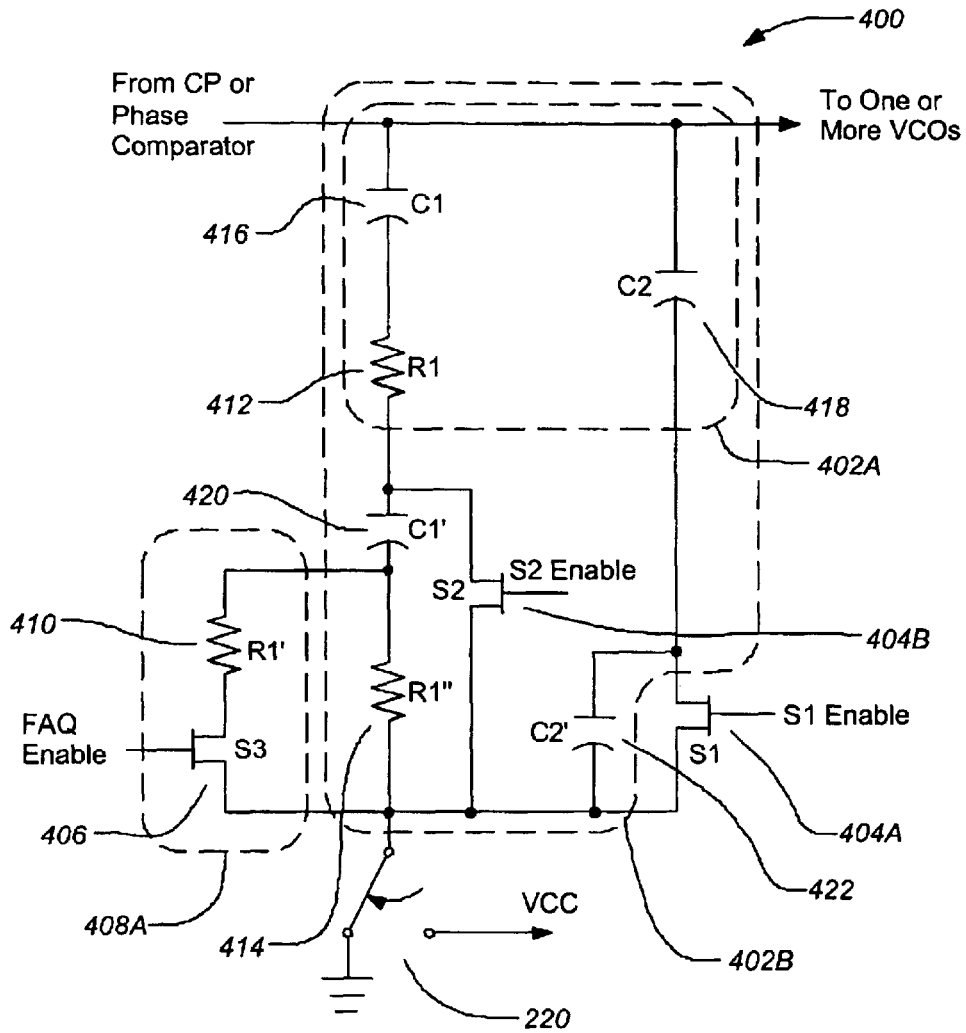
FIG. 4A is a circuit diagram of a fourth embodiment of the present invention.
FIG. 4B is a table showing the enable switch combinations of the fourth embodiment.

FIGS. 4A and 4B are a circuit 400 and control matrix for a fourth embodiment of the invention. FIG. 4A is a circuit diagram of filter circuit 400. This filter embodiment is designed with a first filter subcircuit 402A and a second filter subcircuit 402B merged in a manner similar to the third filter embodiment above. The first filter subcircuit 402A and the second filter subcircuit 402B share common filter circuit elements.

FIG. 4B is a table showing the switch combinations of the fourth filter 400 embodiment. In this filter circuit 400, selection of the first or second filter subcircuit 402A, 402B is not effected by activating one switch and deactivating another switch as in the previous embodiments. To enable the first filter subcircuit 402A, the first and second enable switches 404A, 404B are both activated in a first switch combination. To enable the second filter subcircuit 402B, the first and second enable switches 404A, 404B are both deactivated in a second switch combination. Here also, the first and second filter subcircuits 402A, 402B can use different charge pump current settings. In addition, a fast acquisition switch 406 is used to enable a fast acquisition subcircuit 408A for the filter in a manner similar to the previous embodiments.

Fast acquisition with the fast acquisition subcircuit 408A in this filter circuit 400 is only available when the second enable switch 404B is deactivated. This is because the second enable switch 404B shorts the fast acquisition subcircuit 408A when it is activated. Because the switch combinations determine that the second enable switch 404B is deactivated only when the second filter subcircuit 402B is enabled, fast acquisition is only available when the second filter subcircuit 402B is enabled in this example. In addition, when the fast acquisition subcircuit 408A is enabled, a fast acquisition resistor 410 is placed in parallel with only one of two resistors 412 or 414. FIG. 4A shows the fast acquisition resistor 410 connected in parallel to resistor 414. Therefore, for some designs the fast acquisition resistance can be eliminated so that enabling fast acquisition merely entails shorting the resistor 414. In other words, the fast acquisition resistor 410 would have a value of zero. In this case, the total effective resistance becomes just the value of the resistor 412. In any case, the charge pump current must be appropriately adjusted by the factor, F, to keep the loop stable when fast acquisition is enabled.

However, fast acquisition can still be effected for filter subcircuit 402A by momentarily switching to a higher bandwidth filter subcircuit 402B as previously discussed regarding filter circuits 250 and 300. The charge pump current must be temporarily adjusted to the charge pump current setting of filter subcircuit 402B. Thus, the lock time performance can be improved even without a dedicated fast acquisition subcircuit.

Because two series connected resistors 412, 414 are used in the second filter subcircuit 402B, the fast acquisition bandwidth expansion is somewhat different from the previous embodiments. In this case, the required $R_{TOTAL}$ is based upon the sum of the two resistors 412, 414 as shown in Table 2 below. Fast acquisition modifies only one resistance value of the series connected resistors (i.e., R1").

TABLE 2

Fast Acquisition Bandwidth Expansion for Fast acquisition Resistor in Parallel with One of Multiple Series-Connected Resistors

| Bandwidth Expansion | Fast Acquisition (FAQ) | $R_{TOTAL}$ = R1 + R1'//R1" |
|---|---|---|
| $\approx \sqrt{F}$ | ×F | $\dfrac{R1 + R1''}{\sqrt{F}}$ |
| $\approx \sqrt{4}$ | ×4 | $\dfrac{R1 + R1''}{\sqrt{4}}$ |
| $\approx \sqrt{8}$ | ×8 | $\dfrac{R1 + R1''}{\sqrt{8}}$ |
| $\approx \sqrt{16}$ | ×16 | $\dfrac{R1 + R1''}{\sqrt{16}}$ |

Thus, the appropriate fast acquisition resistor 410 value (R1') is somewhat different than in the previous embodiments. The necessary total resistance can be determined from the following equation (6).

$$R_{TOTAL} = R1 + \frac{R1' \times R1''}{R1' + R1''} \quad (6)$$

Solving for the fast acquisition resistor value yields the following equation (7).

$$R1' = \frac{R1''(R_{TOTAL} - R1)}{R1'' + R1 - R_{TOTAL}} \quad (7)$$

As before, the general solution can be obtained by applying the general form of $R_{TOTAL}$ including fast acquisition factor, F, to yield equation (8).

$$R1' = \frac{R1''[R'' - R1(\sqrt{F} - 1)]}{(R1'' + R1)(\sqrt{F} - 1)} \quad (8)$$

The fourth filter 400 embodiment has a first filter subcircuit 402A with characteristics like those of the previous embodiments, a first capacitor 416 and first resistor 412 in a series, both in parallel with a second capacitor 418. However, the second filter subcircuit 402B does not use only the first resistor 412 in this embodiment. A second resistor 414 and a third capacitor 420 are also placed in series connection with the first resistor 412 and first capacitor 416 when the second filter subcircuit 402B is enabled. As described in the previous embodiments, this yields a total effective resistance of the sum of the resistors 412, 414 and a total effective capacitance of the reciprocal of the sum of the reciprocals of the capacitors 416, 420. A fourth capacitor 422 is also placed in series with the second capacitor 418 in this second filter subcircuit 402B. This also yields a total effective capacitance of the reciprocal of the sum of the reciprocals of the capacitors 418, 422 for this leg of the circuit. The total effective values for each of the circuit elements are provided in the table of FIG. 4B. Values for these various elements are selected such that the first filter subcircuit 402A obtains a low bandwidth, while the second filter subcircuit obtains a high bandwidth.

Figures 4C, 4D:
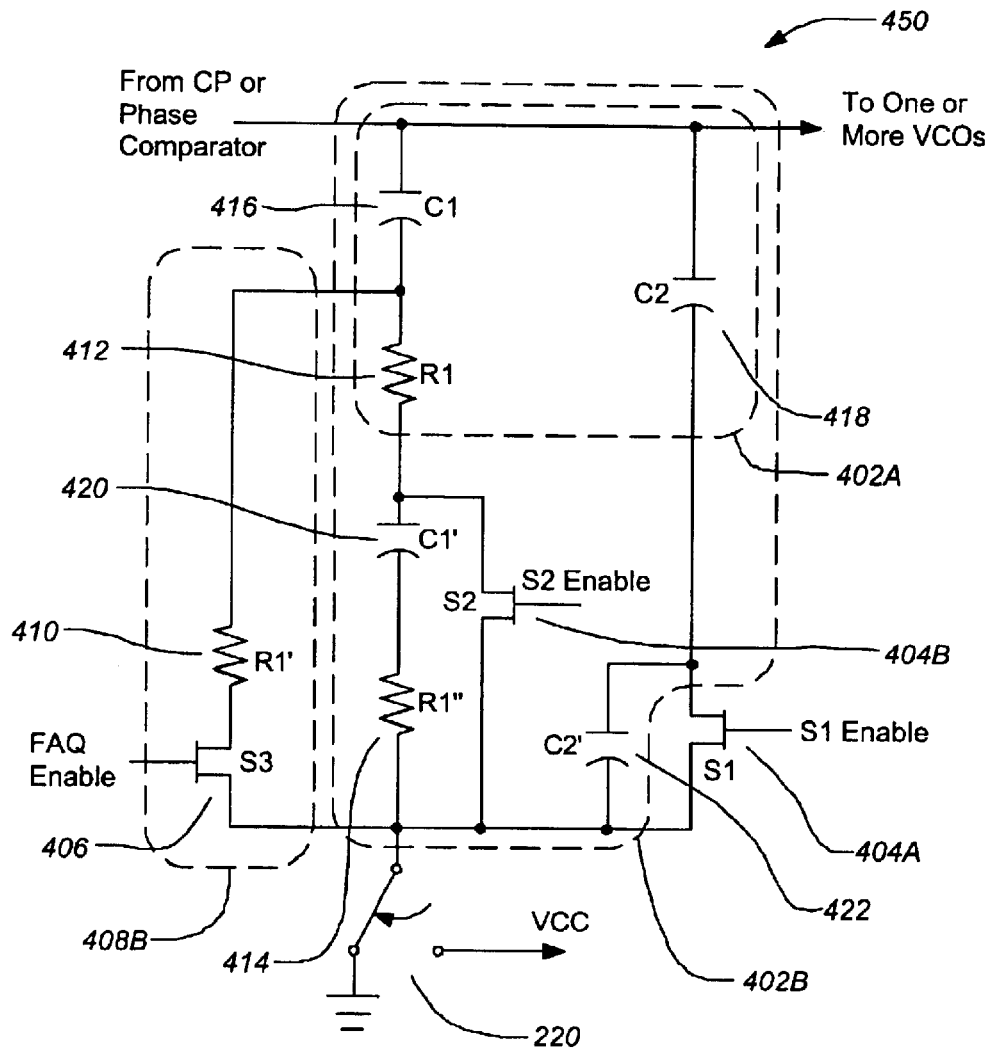
FIG. 4C is a circuit diagram of a modified fourth embodiment of the present invention.
FIG. 4D is a table showing the enable switch combinations of the modified fourth embodiment.

FIGS. 4C and 4D are a circuit 450 and control matrix for a modified embodiment of the circuit 400 of FIGS. 4A and 4B. In this circuit 450, the fast acquisition resistor 410 of the fast acquisition subcircuit 408B is tapped in at a point between the resistor 412 and the capacitor 416. The circuit 450 is otherwise identical to that of FIG. 4A. Consequently, fast acquisition operates somewhat differently, however, the circuit 450 otherwise functions in the same manner as the previous circuit 400.

As shown in FIG. 4D, fast acquisition is now available when the first filter subcircuit 402A is activated. Because enabling fast acquisition connects just two resistors in parallel, the first resistor 412 and the fast acquisition resistor 410, fast acquisition operates in a manner very similar to that of the second and third embodiments previously described.

When fast acquisition is activated with the second filter subcircuit 402B in the modified circuit 450, the circuit functions very similar to the second and third embodiments. However, in this case, the second resistor 414 is now added to the first resistor 412 and both are connected in parallel with the fast acquisition resistor 410. The analysis is identical, except that the first resistor R1 is now replaced with the sum of R1 and R1'. Thus, the Table 3 below provides examples of bandwidth expansion, FAQ and the total effective resistance ($R_{TOTAL}$), which are correlated by a factor, F (i.e. the charge pump current multiplier).

TABLE 3

Fast Acquisition Bandwidth Expansion for Fast acquisition Resistor in Parallel with Multiple Series-Connected Resistors

| Bandwidth Expansion | Fast Acquisition (FAQ) | $R_{TOTAL}$ = [(R1 + R1")//R1'] |
|---|---|---|
| $\approx \sqrt{F}$ | ×F | $\dfrac{R1 + R1''}{\sqrt{F}}$ |

TABLE 3-continued

Fast Acquisition Bandwidth Expansion for Fast acquisition Resistor in Parallel with Multiple Series-Connected Resistors

| Bandwidth Expansion | Fast Acquisition (FAQ) | $R_{TOTAL} = [(R1 + R1'')//R1']$ |
|---|---|---|
| $\approx \sqrt{4}$ | ×4 | $\dfrac{R1 + R1''}{\sqrt{4}}$ |
| $\approx \sqrt{8}$ | ×8 | $\dfrac{R1 + R1''}{\sqrt{8}}$ |
| $\approx \sqrt{16}$ | ×16 | $\dfrac{R1 + R1''}{\sqrt{16}}$ |

The total effective resistance for the combination of resistors 412, 414 and 406 is given by the following equation (9).

$$R_{TOTAL} = \frac{R1' \times (R1 + R1'')}{R1 + R1' + R1''} \quad (9)$$

Thus, solving equation (9), the necessary value for the fast acquisition resistor (R1') 410 can be determined by applying the appropriate $R_{TOTAL}$ value to the following equation (10).

$$R1' = \frac{(R1 + R1'') \times R_{TOTAL}}{(R1 + R1'') - R_{TOTAL}} \quad (10)$$

In a general form, including the factor, F, R1' can now be determined from equation (11).

$$R1' = \frac{R1 + R1''}{\sqrt{F} - 1} \quad (11)$$

In effect, the addition of the second resistor (R1'') 414 in the modified circuit 450 is equivalent to increasing the value of the first resistor 412.

3. Example Method Embodiment

Figure 5:
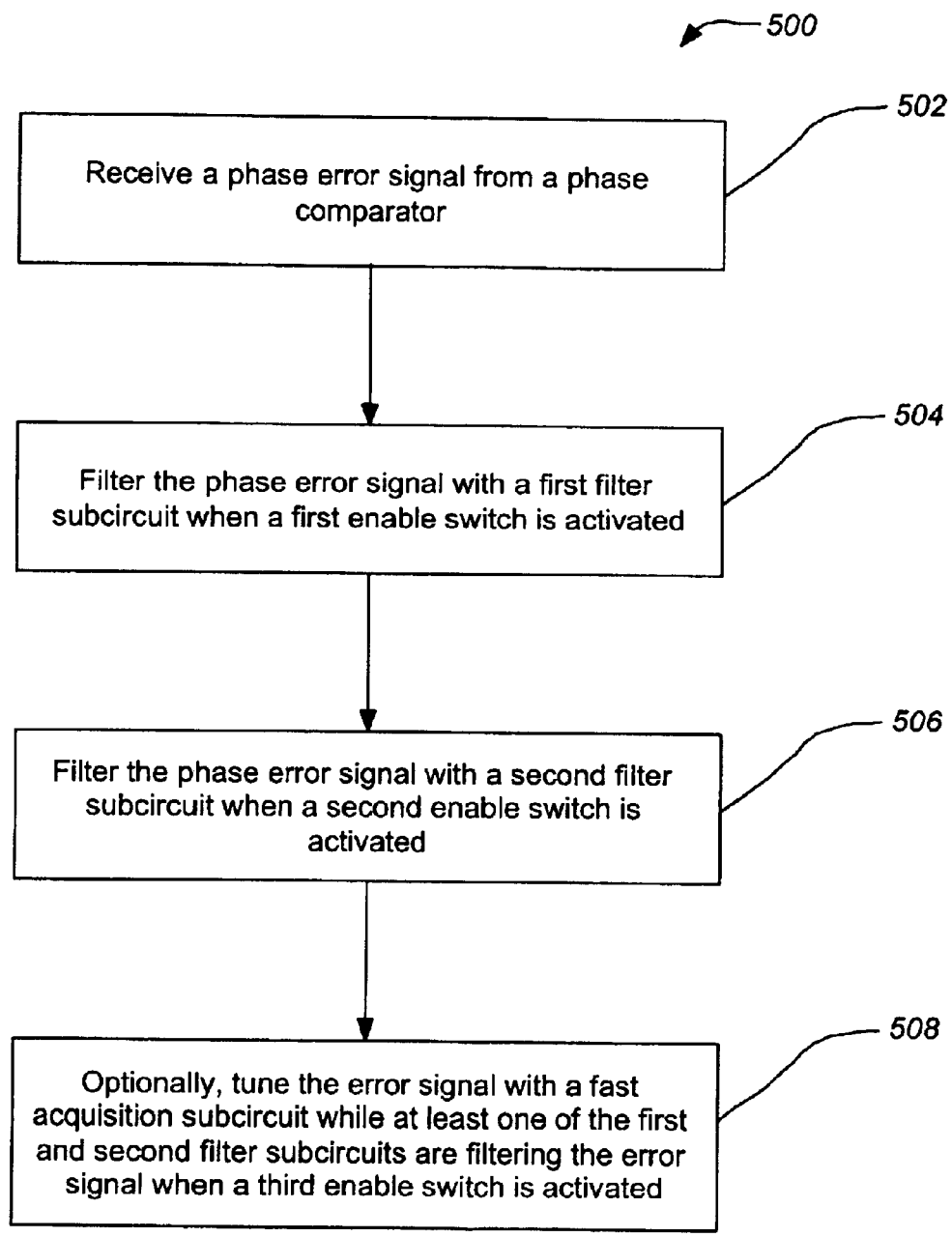
FIG. 5 is a flowchart illustrating a method of filtering a phase error signal according to the invention.

FIG. 5 is a flowchart 500 illustrating a method of filtering a phase error signal according to the invention. The method begins by receiving a phase error signal from a phase comparator at block 502. The phase error signal is filtered with a first filter subcircuit when a first enable switch is activated at block 504. The phase error signal is filtered with a second filter subcircuit when a second enable switch is activated at block 506. Optionally, the error signal may be fast acquisitiond by a fast acquisition subcircuit while at least one of the first and second filter subcircuits are filtering the error signal when a third enable switch is activated at block 508. Such fast acquisition may be temporarily enabled to improve the overall performance of the PLL circuit.

CONCLUSION

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture and use of the apparatus and method of the invention. Since many embodiments of the invention can be made without departing from the scope of the invention, the invention resides in the claims hereinafter appended.

What is claimed is:

1. An apparatus for filtering a phase error signal, comprising:

a first filter subcircuit receiving a phase error signal from a phase comparator and filtering the error signal with the first filter subcircuit when enabled;

a second filter subcircuit receiving the phase error signal from the phase comparator and filtering the error signal with the second filter subcircuit when enabled;

a first enable switch and a second enable switch which are activated in combination to control filtering of the error signal;

a fast acquisition subcircuit including a fast acquisition enable switch for changing a charge pump current through at least one of the first and second filter subcircuits; and wherein the first filter subcircuit is enabled by activating a first combination of the first and second enable switches and the second filter subcircuit is enabled by activating a second combination of the first and second enable switches.

2. The apparatus of claim 1, wherein the second filter subcircuit has a higher bandwidth than the first filter subcircuit and the second filter subcircuit is momentarily activated to fast acquisition with the first filter subcircuit.

3. The apparatus of claim 1, wherein fast acquisition of one of the first and second filter subcircuits is enabled when the fast acquisition switch is activated.

4. The apparatus of claim 3, wherein the fast acquisition subcircuit is temporarily enabled to underdampen the filtering.

5. The apparatus of claim 3, wherein the fast acquisition subcircuit comprises a fast acquisition resistor which is placed in parallel connection with a first resistor of one of the first and second filter subcircuits when the fast acquisition switch is activated.

6. The apparatus of claim 5, wherein the fast acquisition resistor comprises a resistance of approximately R1' determined by $$R1' = \frac{R1}{\sqrt{F} - 1},$$

where R1 comprises the first resistor of the one of the first and second filter subcircuits and F comprises a fast acquisition factor.

7. The apparatus of claim 5, wherein the one of the first and second filter subcircuits further comprises a second resistor in series connection with the first resistor.

8. The apparatus of claim 7, wherein the fast acquisition resistor comprises a resistance of approximately R1' determined by $$R1' = \frac{R1''[R'' - R1(\sqrt{F} - 1)]}{(R1'' + R1)(\sqrt{F} - 1)},$$

where R1 comprises the first resistor and R1' comprises the second resistor of the one of the first and second filter subcircuits and F comprises a fast acquisition factor.

9. The apparatus of claim 7, wherein the fast acquisition resistor comprises a resistance of approximately R1' determined by $$R1' = \frac{R1 + R1''}{\sqrt{F} - 1},$$

where R1 comprises the first resistor and R1" comprises the second resistor of the one of the first and second filter subcircuits and F comprises a fast acquisition factor.

10. The apparatus of claim 1, wherein the first filter subcircuit and the second filter subcircuit share common filter circuit elements.

11. The apparatus of claim 10, wherein the shared common filter circuit elements are a first capacitor and a first resistor in series both connected in parallel to a second capacitor.

12. The apparatus of claim 10, wherein the first filter subcircuit comprises filter circuit elements that are a subset of filter circuit elements of the second filter subcircuit.

13. The apparatus of claim 10, wherein the first combination comprises activating the first enable switch and deactivating the second enable switch to place a first capacitor in series connection with a first resistor and both the first capacitor and first resistor in parallel connection with second capacitor.

14. The apparatus of claim 10, wherein the second combination comprises deactivating the first enable switch and activating the second enable switch which places a first and a third capacitor in parallel connection and the first and third capacitor both in series connection with a first resistor and the first and third capacitor and the first resistor are all placed in parallel connection with a second and a fourth capacitor in series connection.

15. The apparatus of claim 10, wherein the first combination comprises activating both the first enable switch and the second enable switch to place a first capacitor in series connection with a first resistor and both the first capacitor and first resistor in parallel connection with a second capacitor.

16. The apparatus of claim 10, wherein the second combination comprises deactivating both the first enable switch and the second enable switch to place a first and a third capacitor and a first resistor all in series connection and all in parallel connection with a second and a fourth capacitor in series connection.

17. The apparatus of claim 1, wherein the first and the second enable switches are field effect transistors.

18. The apparatus of claim 1, wherein when the first enable switch is activated the first filter subcircuit is alternately referenced to a ground and a common cathode voltage selectable by a reference switch.

19. The apparatus of claim 1, wherein when the second enable switch is activated the second filter subcircuit is alternately referenced to a ground and a common cathode voltage selectable by a reference switch.

20. The apparatus of claim 1, wherein the first and second filter subcircuits each comprise a resistor-capacitor filter including a first capacitor and a first resistor in series both connected in parallel to a second capacitor.

21. The apparatus of claim 1, wherein the first and second filter subcircuits are implemented on a single integrated circuit.

22. The apparatus of claim 21, wherein the first and second enable switches are external to the integrated circuit.

23. The apparatus of claim 21, wherein the first and second enable switches are internal to the integrated circuit.

24. An apparatus for filtering a phase error signal, comprising:

a first filter subcircuit means for receiving a phase error signal from a phase comparator and filtering the error signal with the first filter subcircuit when enabled;

a second filter subcircuit means for receiving the phase error signal from the phase comparator and filtering the error signal with the second filter subcircuit when enabled;

a first enable switching means and a second enable switching means for activating in combination to control filtering of the error signal;

a fast acquisition subcircuit means for fast acquisition one of the first and second filter subcircuits when a fast acquisition switching means for enabling the fast acquisition subcircuit means is activated; and wherein the first filter subcircuit is enabled by activating a first combination of the first and second enable switches, the second filter subcircuit is enabled by activating a second combination of the first and second enable switches, and the fast acquisition subcircuit means is temporarily enabled to underdampen the filtering.

25. The apparatus of claim 24, wherein the second filter subcircuit means has a higher bandwidth than the first filter subcircuit means and the second filter subcircuit means is momentarily activated to fast acquisition with the first filter subcircuit means.

26. The apparatus of claim 24, wherein the fast acquisition subcircuit means comprises a fast acquisition resistor which is placed in parallel connection with a first resistor of one of the first and second filter subcircuit means when the fast acquisition switch is activated.

27. The apparatus of claim 26, wherein the fast acquisition resistor comprises a resistance of approximately R1' determined by $$R1' = \frac{R1}{\sqrt{F} - 1},$$

where R1 comprises the first resistor of the one of the first and second filter subcircuit means and F comprises a fast acquisition factor.

28. The apparatus of claim 26, wherein the one of the first and second filter subcircuit means further comprises a second resistor in series connection with the first resistor.

29. The apparatus of claim 28, wherein the fast acquisition resistor comprises a resistance of approximately R1' determined by $$R1' = \frac{R1''[R'' - R1(\sqrt{F} - 1)]}{(R1'' + R1)(\sqrt{F} - 1)},$$

where R1 comprises the first resistor and R1" comprises the second resistor of the one of the first and second filter subcircuit means and F comprises a fast acquisition factor.

30. The apparatus of claim 28, wherein the fast acquisition resistor comprises a resistance of approximately R1' determined by $$RI' = \frac{R1 + R1''}{\sqrt{F} - 1},$$

where R1 comprises the first resistor and R1" comprises the second resistor of the one of the first and second filter subcircuit means and F comprises a fast acquisition factor.

31. The apparatus of claim 24, wherein the first filter subcircuit means and the second filter subcircuit means share common filter circuit elements.

32. The apparatus of claim 31, wherein the shared common filter circuit elements are a first capacitor and a first resistor connected in series both the first capacitor and first resistor connected in parallel to a second capacitor.

33. The apparatus of claim 31, wherein the first filter subcircuit means comprises filter circuit elements that are a subset of filter circuit elements of the second filter subcircuit means.

34. The apparatus of claim 31, wherein the first combination comprises activating the first enable switching means and deactivating the second enable switching means which places a first capacitor in series connection with a first resistor both in parallel connection with second capacitor.

35. The apparatus of claim 31, wherein the second combination comprises deactivating the first enable switching means and activating the second enable switching means which places a first and third capacitor in parallel connection, both in series connection with a first resistor and the first and third capacitor and first resistor are all placed in parallel connection with a second and fourth capacitor in series connection.

36. The apparatus of claim 31, wherein the first combination comprises activating the both the first enable switching means and the second enable switching means which places a first capacitor in series connection with a first resistor both in parallel connection with second capacitor.

37. The apparatus of claim 31, wherein the second combination comprises deactivating both the first enable switching means and the second enable switching means which places a first and third capacitor and a first resistor all in series connection, all placed in parallel connection with a second and fourth capacitor in series connection.

38. The apparatus of claim 24, wherein the first and second enable switching means are field effect transistors.

39. The apparatus of claim 24, wherein when the first enable switching means is activated, the first filter subcircuit means is alternately referenced to a ground and a common cathode voltage selectable by a reference switching means.

40. The apparatus of claim 24, wherein when the second enable switching means is activated the second filter subcircuit means is alternately referenced to a ground and a common cathode voltage selectable by a reference switching means.

41. The apparatus of claim 24, wherein the first and second filter subcircuit means each comprise a resistor-capacitor filter including a first capacitor and a first resistor in series both connected in parallel to a second capacitor.

42. The apparatus of claim 24, wherein the first and second filter subcircuit means are implemented on a single integrated circuit.

43. The apparatus of claim 42, wherein the first and second enable switching means are external to the integrated circuit.

44. The apparatus of claim 42, wherein the first and second enable switching means are internal to the integrated circuit.

45. A method of filtering a phase error signal in a phase lock loop, comprising the steps of:
receiving a phase error signal from a phase comparator,
filtering the error signal with a first filter subcircuit when the first filter subcircuit is enabled; and
filtering the error signal with a second filter subcircuit when the second filter subcircuit is enabled;
controlling filtering of the error signal by activating a first enable switch and a second enable switch in combination; and
changing a charge pump current through at least one of the first and second subcircuits by activating a fast acquisition subcircuit; and
wherein the first filter subcircuit is enabled by activating a first combination of the first and second enable switches and the second filter subcircuit is enabled by activating a second combination of the first and second enable switches.

46. The method of claim 45, further comprising momentarily activating the second filter subcircuit to fast acquisition with the first filter subcircuit wherein the second filter subcircuit has a higher bandwidth than the first filter subcircuit.

47. The method of claim 45, further comprising fast acquisition of one of the first and second filter subcircuits with the fast acquisition subcircuit when a fast acquisition switch is activated.

48. The method of claim 47, wherein the fast acquisition subcircuit comprises temporarily enabling the fast acquisition subcircuit to underdampen the filtering.

49. The method of claim 47, wherein the fast acquisition subcircuit comprises a fast acquisition resistor which is placed in parallel connection with a first resistor of one of the first and second filter subcircuits when the fast acquisition switch is activated.

50. The method of claim 49, wherein the fast acquisition resistor comprises a resistance of approximately R1' determined by $$RI' = \frac{R1}{\sqrt{F} - 1},$$

where R1 comprises the first resistor of the one of the first and second filter subcircuits and F comprises a fast acquisition factor.

51. The method of claim 49, wherein the one of the first and second filter subcircuits further comprises a second resistor in series connection with the first resistor.

52. The method of claim 51, wherein the fast acquisition resistor comprises a resistance of approximately R1' determined by $$RI' = \frac{R1''[R'' - R1(\sqrt{F} - 1)]}{(R1'' + R1)(\sqrt{F} - 1)},$$

where R1 comprises the first resistor and R1" comprises the second resistor of the one of the first and second filter subcircuits and F comprises a fast acquisition factor.

53. The method of claim 51, wherein the fast acquisition resistor comprises a resistance of approximately R1' determined by $$RI' = \frac{R1 + R1''}{\sqrt{F} - 1},$$

where R1 comprises the first resistor and R1" comprises the second resistor of the one of the first and second filter subcircuit means and F comprises a that acquisition factor.

54. The method of claim 45, wherein the first filter subcircuit and the second filter subcircuit share common circuit elements.

55. The method of claim 54, wherein the shared common circuit elements are a first capacitor and a first resistor in series both connected in parallel to a second capacitor.

56. The method of claim 54, wherein the first filter subcircuit comprises filter circuit elements that are a subset of filter circuit elements of the second filter subcircuit.

57. The method of claim 54, wherein the first combination comprises activating the first enable switch and deactivating the second enable switch which places a first capacitor in series connection with a first resistor both in parallel connection with second capacitor.

58. The method of claim 54, wherein the second combination comprises deactivating the first enable switch and activating the second enable switch which places a first and third capacitor in parallel connection, both in series connection with a first resistor and the first and third capacitor and first resistor are all placed in parallel connection with a second and fourth capacitor in series connection.

59. The method of claim 54, wherein the first combination comprises activating the both the first enable switch and the second enable switch which places a first capacitor in series connection with a first resistor both in parallel connection with second capacitor.

60. The method of claim 54, wherein the second combination comprises deactivating both the first enable switch and the second enable switch which places a first and third capacitor and a first resistor all in series connection, all placed in parallel connection with a second and fourth capacitor in series connection.

61. The method of claim 45, wherein the first and second enable switches are field effect transistors.

62. The method of claim 45, wherein when the first enable switch is activated the first filter subcircuit is alternately referenced to a ground and a common cathode voltage selectable by a reference switch.

63. The method of claim 45, wherein when the second enable switch is activated the second filter subcircuit is alternately referenced to a ground and a common cathode voltage selectable by a reference switch.

64. The method of claim 45, wherein the first and second filter subcircuits each comprise a resistor-capacitor filter including a first capacitor and a first resistor in series both connected in parallel to a second capacitor.

65. The method of claim 45, wherein the first and second filter subcircuits are implemented on a single integrated circuit.

66. The method of claim 65, wherein the first and second enable switches are external to the integrated circuit.

67. The method of claim 65, wherein the first and second enable switches are internal to the integrated circuit.

* * * * *